United States Patent
Clark et al.

(10) Patent No.: US 8,039,736 B2
(45) Date of Patent: Oct. 18, 2011

(54) PHOTOVOLTAIC UP CONVERSION AND DOWN CONVERSION USING RARE EARTHS

(76) Inventors: Andrew Clark, Los Altos, CA (US);
Robin Smith, Mountain View, CA (US);
Scott Semans, Sunnyvale, CA (US);
Richard Sewell, Mountain View, CA (US)

(*) Notice: Subject to any disclaimer, the term of this patent is extended or adjusted under 35 U.S.C. 154(b) by 139 days.

(21) Appl. No.: 12/408,297

(22) Filed: Mar. 20, 2009

(65) Prior Publication Data
US 2010/0038521 A1 Feb. 18, 2010

(51) Int. Cl.
*H01L 31/055* (2006.01)
*H01L 31/028* (2006.01)
(52) U.S. Cl. ........................................ 136/257; 136/261
(58) Field of Classification Search .................. 136/238, 136/261, 257
See application file for complete search history.

(56) References Cited

U.S. PATENT DOCUMENTS

| | | | |
|---|---|---|---|
| 6,621,211 B1* | 9/2003 | Srivastava et al. | 313/503 |
| 2005/0156155 A1* | 7/2005 | Atanackovic | 257/19 |
| 2008/0087326 A1* | 4/2008 | Scholes et al. | 136/263 |
| 2009/0223553 A1* | 9/2009 | Thoroughgood | 136/246 |
| 2009/0235974 A1* | 9/2009 | Mapel et al. | 136/246 |
| 2010/0006143 A1* | 1/2010 | Welser | 136/255 |

* cited by examiner

*Primary Examiner* — Jennifer K. Michener
*Assistant Examiner* — Dustin Q Dam
(74) *Attorney, Agent, or Firm* — Fernandez & Associates, LLP

(57) ABSTRACT

The use of rare-earth (REO, N, P) based materials to covert long wavelength photons to shorter wavelength photons that can be absorbed in a photovoltaic device (up-conversion) and (REO, N, P) materials which can absorb a short wavelength photon and re-emit one (downshifting) or more longer wavelength photons is disclosed. The wide spectral range of sunlight overlaps with a multitude of energy transitions in rare-earth materials, thus offering multiple up-conversion pathways. The refractive index contrast of rare-earth materials with silicon enables a DBR with >90% peak reflectivity and a stop band greater than 150 nm.

15 Claims, 19 Drawing Sheets

US 8,039,736 B2

PHOTOVOLTAIC UP CONVERSION AND DOWN CONVERSION USING RARE EARTHS

PRIORITY

This application claims priority to U.S. 61/089,786 filed on Aug. 18, 2008.

CROSS REFERENCE TO RELATED APPLICATIONS

Applications and patent Ser. Nos. 09/924,392, 10/666,897, 10/746,957, 10/799,549, 10/825,912, 10/825,974, 11/022,078, 11/025,363, 11/025,680, 11/025,681, 11/025,692, 11/025,693, 11/084,486, 11/121,737, 11/187,213, U.S. 20050166834, U.S. 20050161773, U.S. 20050163692, Ser. Nos. 11/053,775, 11/053,785, 11/054,573, 11/054,579, 11/054,627, 11/068,222, 11/188,081, 11/253,525, 11/254,031, 11/257,517, 11/257,597, 11/393,629, 11/398,910, 11/472,087, 11/788,153, 11/858,838, 11/960,418, 12/119,387, 60/820,438, 60/811,311, 61/089,786, Ser. Nos. 12/171,200, 12/119,387, 60/847,767, 60/944,369, 60/949,753, U.S. Pat. No. 7,018,484, U.S. Pat. No. 7,037,806, U.S. Pat. No. 7,135,699, U.S. Pat. No. 7,199,015, all held by the same assignee, contain information relevant to the instant invention and are included herein in their entirety by reference. References, noted at the end, are included herein in their entirety by reference.

BACKGROUND OF THE INVENTION

1. Field of the Invention

The invention relates generally to a device structure for up and down conversion of radiation, typically solar, wherein high energy wavelengths are down converted to lower energy and low energy wavelengths are up converted to higher energy to improve adsorption by a photovoltaic device.

2. Description of Related Art Including Information Disclosed Under 37 CFR 1.97 and 1.98

As an alternative approach to multiple junction solar cells where specific materials are matched to discrete portions of the solar spectrum, conversion works on the principle of moving parts of the spectrum to the wavelength band of a single junction cell. For example it is widely accepted that a single junction, single crystal silicon solar cell has an optimum performance in the wavelength range 500 to 1,100 nm, whilst the solar spectrum extends from 400 nm to in excess of 2500 nm.

Rare earths, the lanthanide series, have long been known for the unique optical properties in which the incomplete, 4f shells exhibit multiple optical transitions many of which lie within the solar spectrum. An example of some of these optical transitions are:

Er: 410, 519, 650, 810, 972, 1,529 nm
Yb: 980 nm
Tb: 485 nm

As used herein [RE1, RE2, ... RE10] are chosen from the lanthanide series of rare earths from the periodic table of elements consisting of $\{^{57}La, ^{58}Ce, ^{59}Pr, ^{60}Nd, ^{61}Pm, ^{62}Sm, ^{63}Eu, ^{64}Gd, ^{65}Tb, ^{66}Dy, ^{67}Ho, ^{68}Er, ^{69}Tm, ^{70}Yb$ and $^{71}Lu\}$ plus yttrium, $^{39}Y$, and scandium, $^{21}Sc$, are included as well for the invention disclosed.

A more complete list can be found in the technical literature. In addition certain of these rare earths, sometimes in combination with one or more rare earths, can absorb light at one wavelength (energy) and re-emit at another (energy). This is the essence of conversion; when the incident energy per photon is less than the emission energy per photon the process is referred to as up conversion. Down conversion is the process in which the incident energy per photon is higher than the emission energy per photon. An example of up conversion is Er absorbing at 1,480 nm and exhibiting photoluminescence at 980 nm.

One concept was patented in U.S. Pat. No. 3,929,510; more recent work in this field has mainly focused on the addition of rare earths to phosphorescent compounds. The historical approaches however add a conversion layer to either a completed solar cell or module with the majority also requiring an additional reflective component to return the converted spectrum back into the cell so that it can contribute to the generated photocurrent. U.S. Pat. No. 7,184,203 discloses up and down conversion with a rare earth compound comprising a rare earth element and at least one other element selected from chalcogens, halogens, nitrogen, phosphorus and carbon; wherein the rare earth compound is not mixed with compounds containing other rare earth elements and wherein the rare earth compound is irradiated at a sufficient intensity to heat the rare earth compound to facilitate electronic transitions. U.S. Pat. No. 7,184,203 does not teach or suggest using a rare earth compound in conjunction with a photovoltaic device; U.S. Pat. No. 7,184,203 teaches away from the use of a rare earth compound with relatively low intensity radiation at room temperature for up or down conversion.

BRIEF SUMMARY OF THE INVENTION

The use of rare-earth (REO, N, P) based materials to covert long wavelength photons to shorter wavelength photons that can be absorbed in a photovoltaic device (up-conversion) and (REO, N, P) materials which can absorb a short wavelength photon and re-emit one (downshifting) or more longer wavelength photons is disclosed. The wide spectral range of sunlight overlaps with a multitude of energy transitions in rare-earth materials, thus offering multiple up-conversion pathways. The refractive index contrast of rare-earth materials with silicon enables a DBR with >90% peak reflectivity and a stop band greater than 150 nm. FIG. 1 is a schematic of a silicon solar cell with an upconverting layer.

In contrast the instant invention discloses a process to manufacture the rare earths in a thin film format that is materially compatible with the underlying silicon semiconductor. One advantage of this is the control it provides over the process both in tuning a material to particular wavelengths and in reproducing the process in a manufacturing environment. Optionally, rare earth oxides, nitrides, and phosphides and/or combinations thereof may be employed. As used herein the terms, "oxides" and "rare-earth oxide[s]" are inclusive of rare earth oxides, nitrides, and phosphides and/or combinations thereof.

BRIEF DESCRIPTION OF THE SEVERAL VIEWS OF THE DRAWING(S)

FIG. 1 is a schematic illustration of prior art.
FIG. 2 is a schematic illustration of rare earth oxide on silicon.
FIG. 3 is a schematic illustration of a rare earth oxide DBR.
FIG. 4 is a schematic illustration of one embodiment with a RE oxide and reflector.
FIG. 5 is a schematic illustration of one embodiment with a RE oxide and a Distributed Bragg Reflector (DBR).
FIG. 6 is a schematic illustration of one embodiment with a RE oxide separating two solar cells.

Figures 14A, 14B:
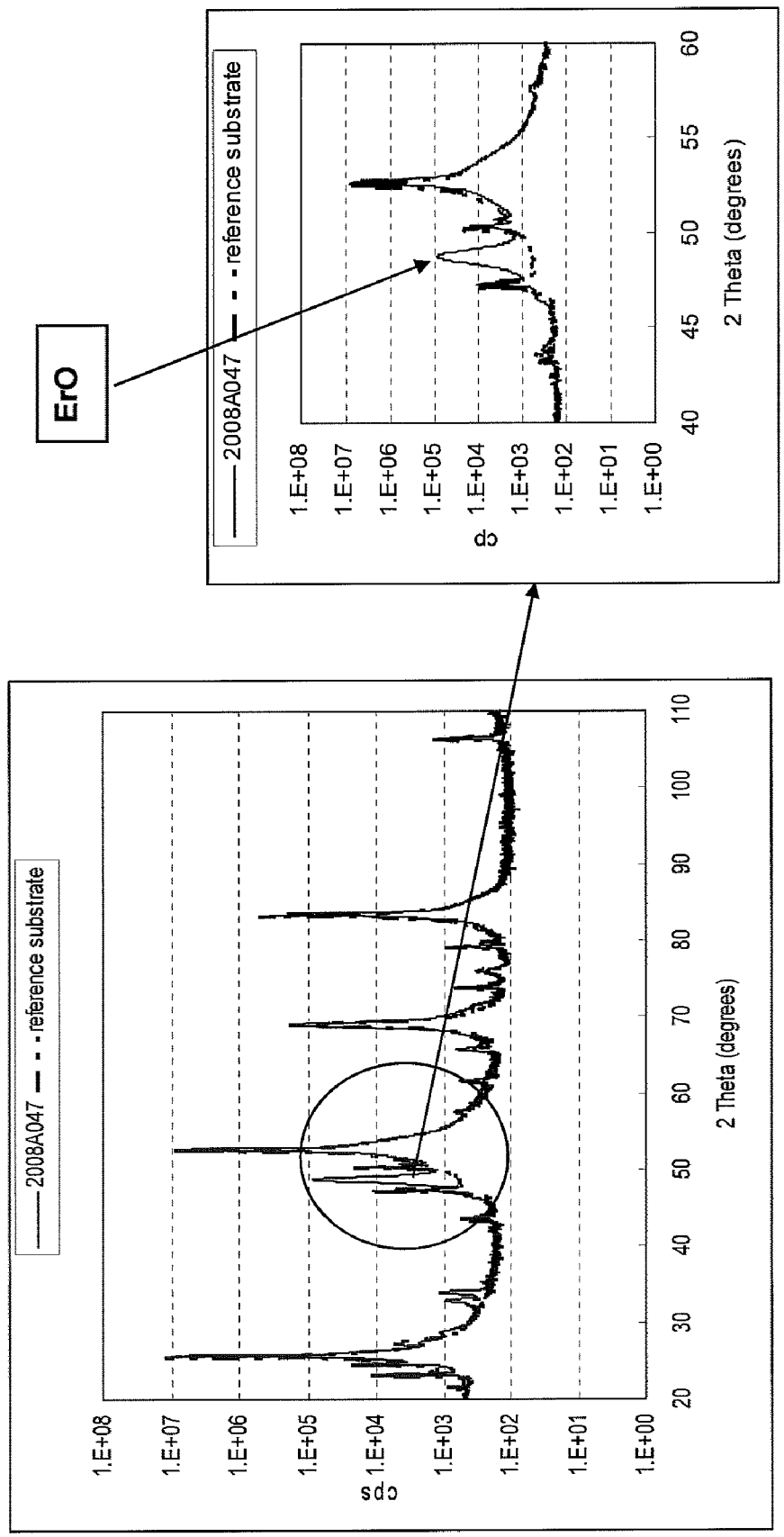

FIGS. 14A and B show x-ray data for rare earth oxide on a transparent substrate.

Figure 15A:
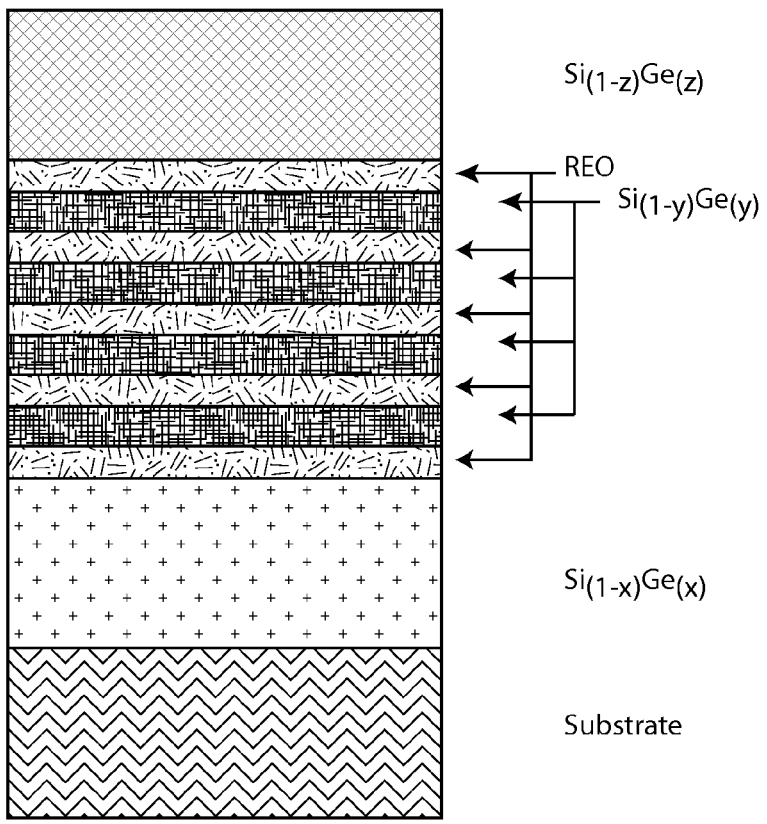

FIGS. 15A and B are schematic illustrations of several embodiments.

Figures 16A, 16B, 16C:
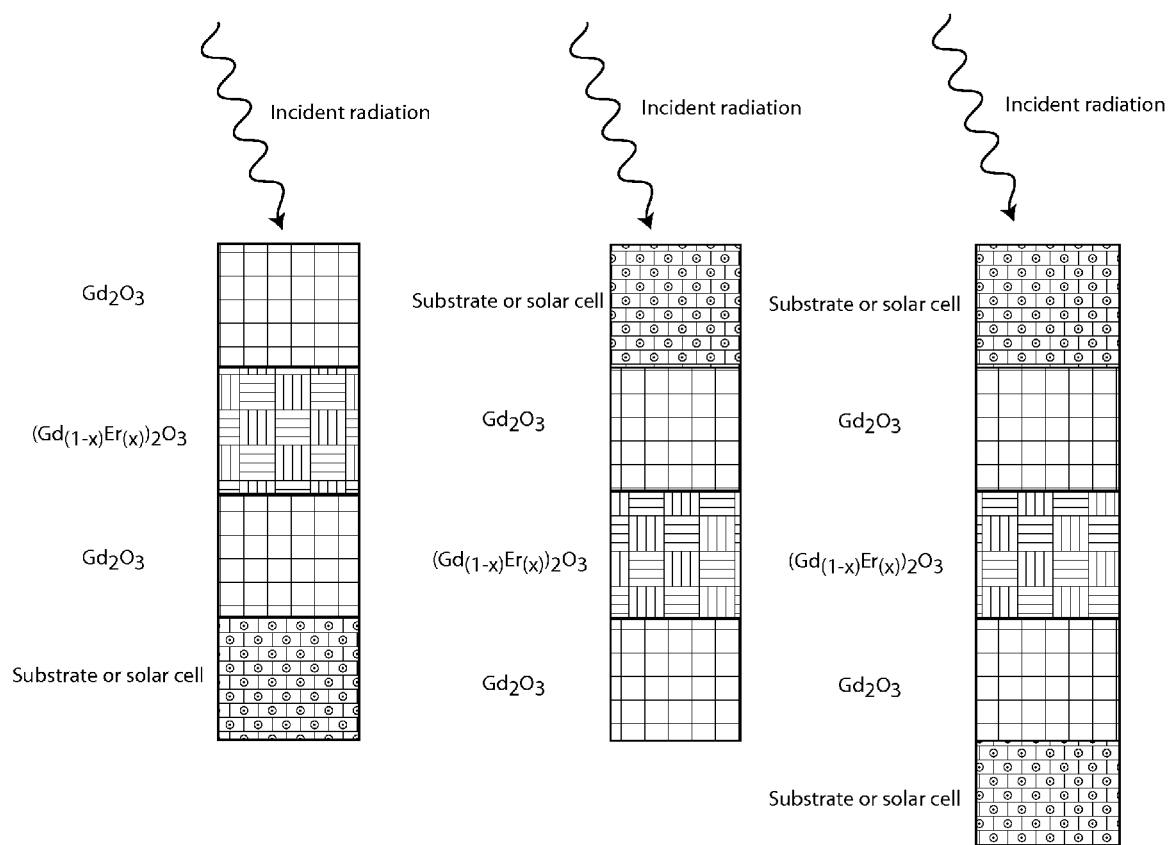

FIGS. 16A, B and C are schematic illustrations of several embodiments.

Figures 17A, 17B, 17C:
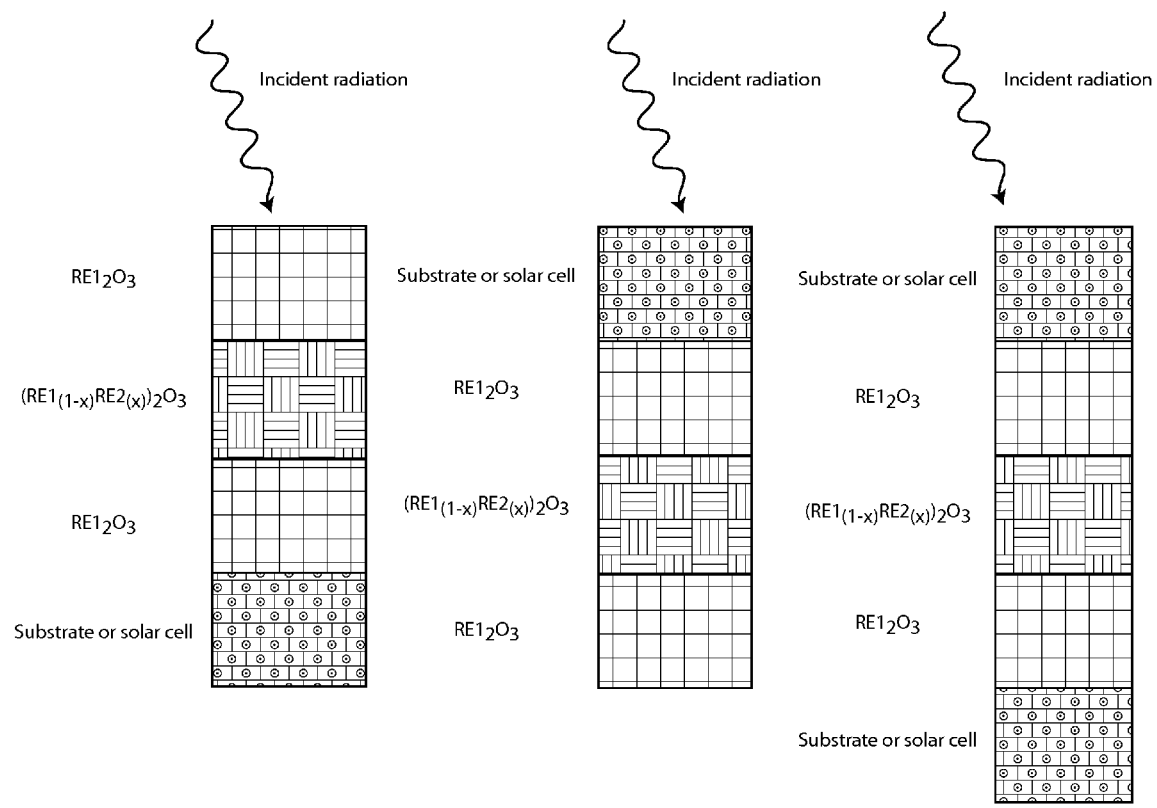

FIGS. 17A, B and C are schematic illustrations of several embodiments.

Figure 18:
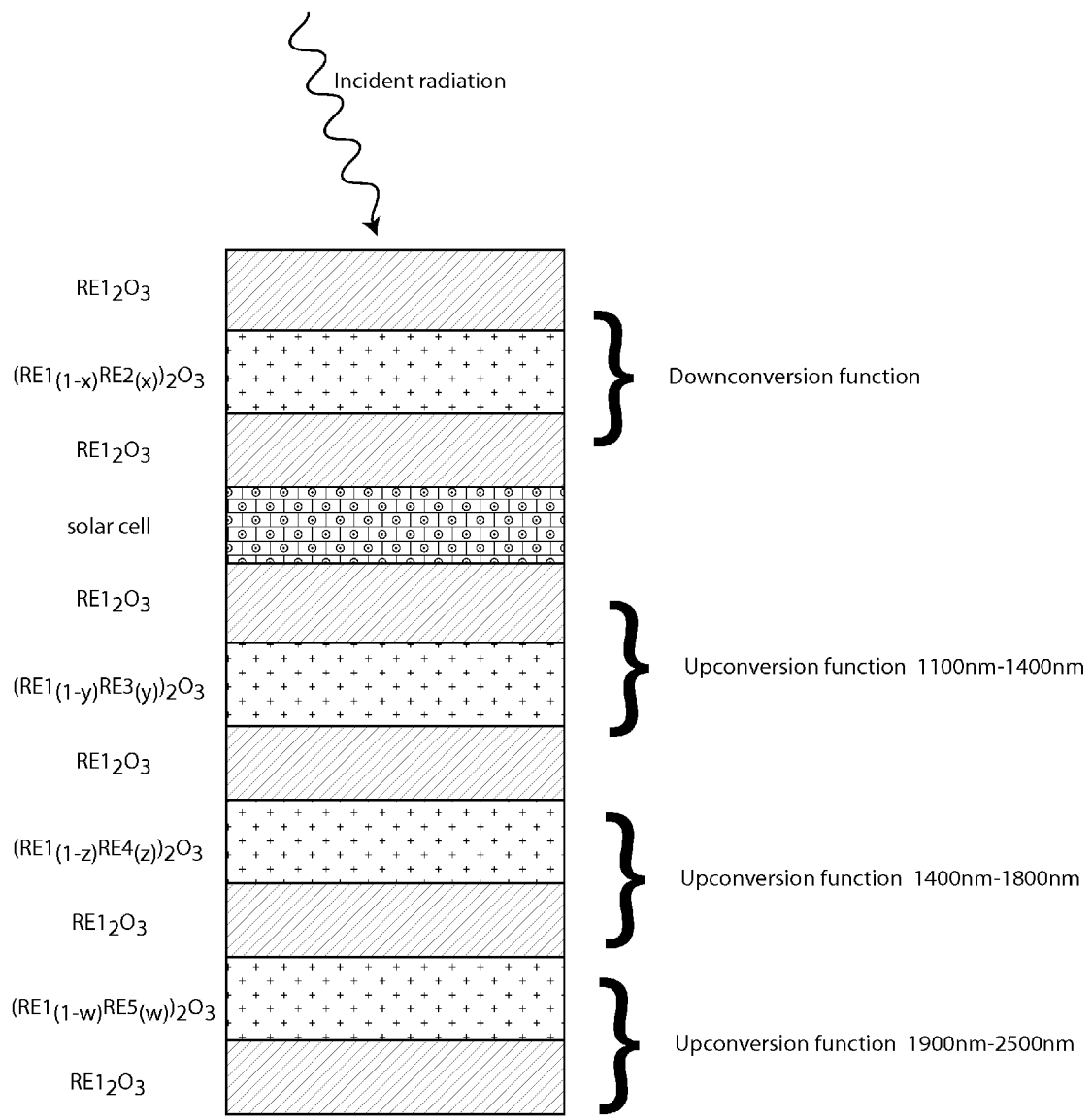

FIG. 18 is a schematic illustration of several embodiments.

Figure 19:
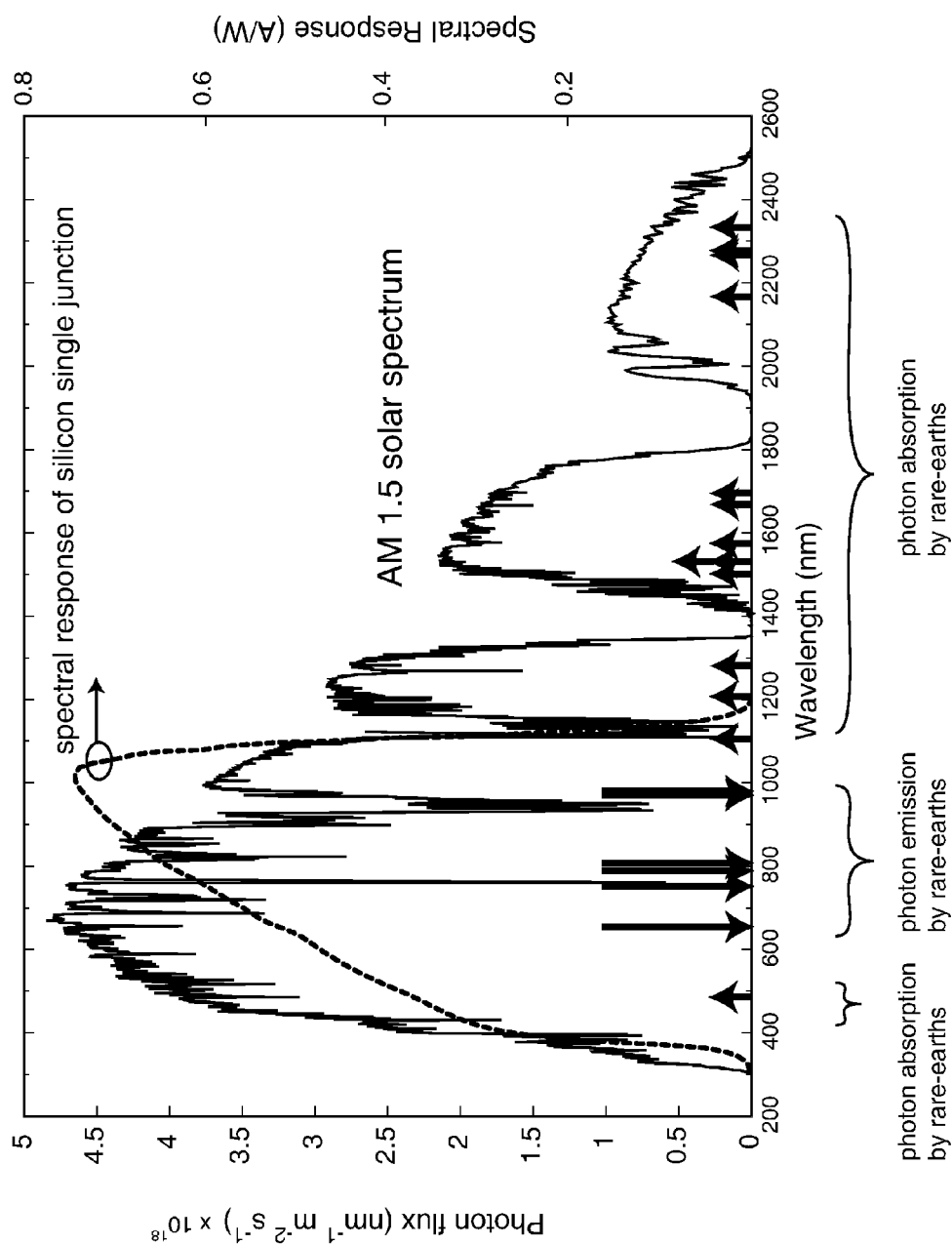

FIG. 19 is a schematic illustration of possible spectral conversion pathways using rare-earth ions.

Figure 20:
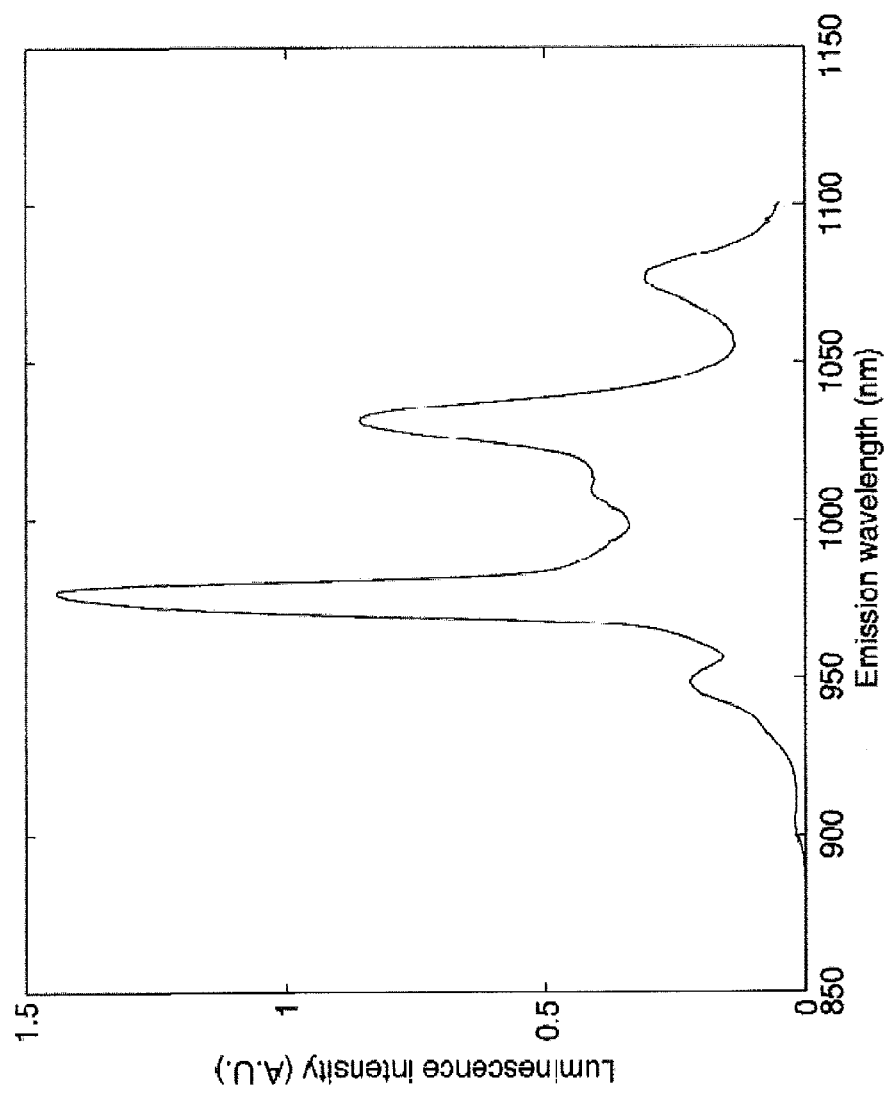

FIG. 20 is a $(Er_{(x)}Yb_{(1-x)})_2O_3$ luminescence spectrum from 1480 nm laser illumination.

Figure 21:
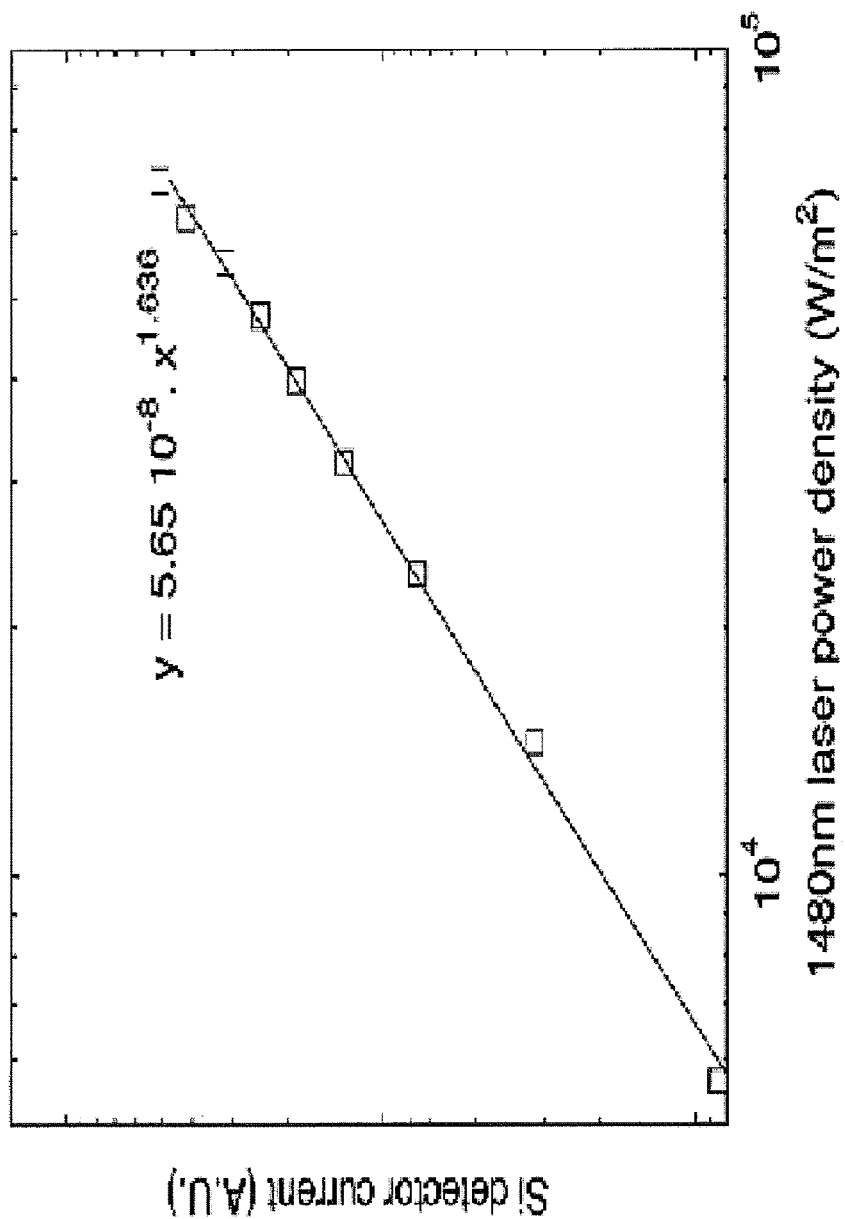

FIG. 21 is a plot of photocurrent from a silicon detector due to up-conversion in an $(Er_{(x)}Yb_{(1-x)})_2O_3$ layer.

DETAILED DESCRIPTION OF THE INVENTION

Figure 1:
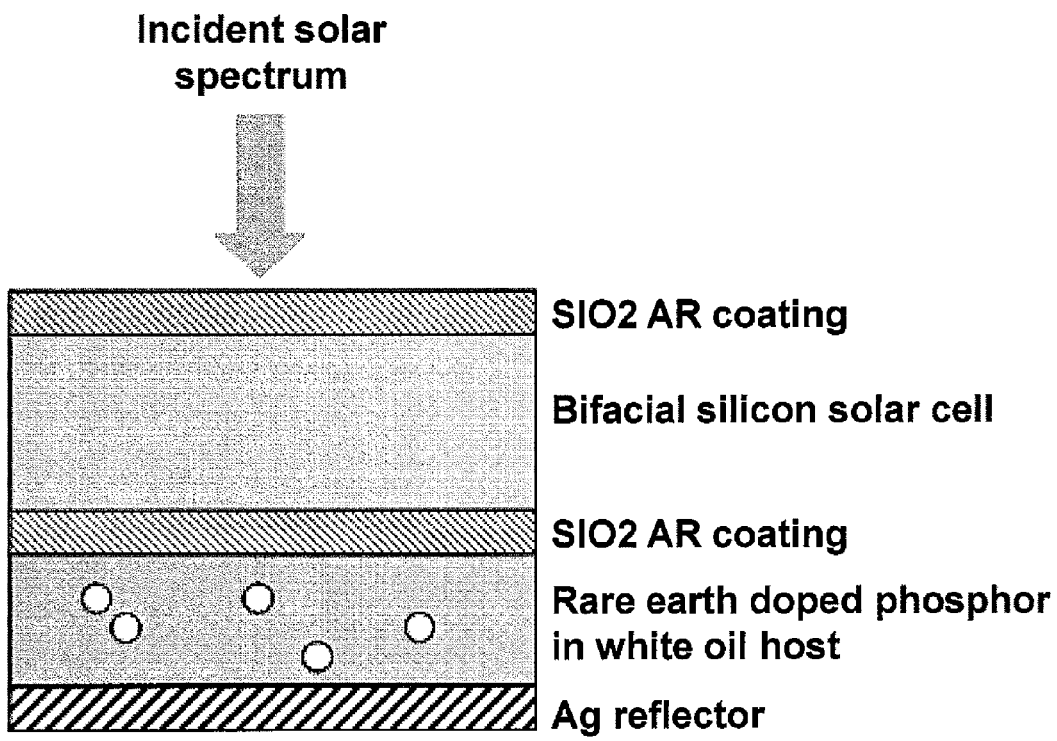
Figure 2:
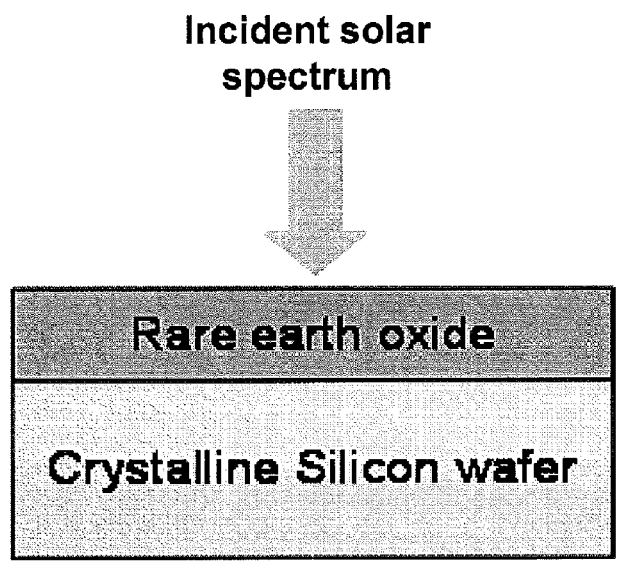

Rare-earth oxides may be added to a semiconductor structure in a single step at the conclusion of the manufacture of epitaxial silicon; optionally, not. This placement in the process flow also facilitates the same layer being used for passivation of the silicon surface; optionally, a rare-earth layer may be designed as an anti reflective coating. The ability of a rare earth oxide to do additional functions has been previously reported though frequently not using a single crystal material or multiple rare earths; note FIG. 1 showing a prior art example. It is important to note that rare earth oxides do not need epitaxial silicon; rare earth oxides perform all of the same tasks when placed onto a wafer of silicon as part of an overall production of a solar cell, with a proviso that any process used must produce a single crystal oxide; optionally large grain, small grain, micro grain and nano grain rare-earths are also disclosed.

Examples of device structures utilizing layers of single crystal rare earth oxides to perform the tasks of up conversion, and/or down conversion along with, optionally, designing in required optical and/or anti reflective properties are now given. In embodiments of the instant invention, x, y and z range from 0 up to and including 1. A substrate may be silicon, poly or multi-crystalline silicon, silicon dioxide or glass; as used herein multi-crystalline includes poly, micro and nano crystalline. The number of REO/Si(1-y)Ge(y) bilayers may range from one to more than one hundred. "A layer" also comprises multiple layers, optionally. REO, Si(1-x)Ge(x), Si(1-y)Ge(y), and Si(1-z)Ge(z) layers are optionally single crystal, multi-crystalline or amorphous layers and are, optionally, optically active dielectrics compatible with semiconductor processing techniques. As used herein a "REO" layer contains two or more elements, at least one chosen from the Lanthanide series plus Scandium and Yttrium and at least one chosen from oxygen and/or nitrogen and/or phosphorous and/or mixtures thereof; structures are not limited to specific rare-earth elements cited in examples. Rare earth material are represented as $(RE1+RE2+\ldots REn)_mO_n$ where the total mole fraction of rare earths, $1\ldots n$, is one. In some embodiments, in addition to the RE $(1, 2, \ldots n)$ an alloy may include Si and/or Ge and/or C; optionally an oxide may be an oxynitride or oxyphosphide; m and n may vary from greater than 0 to 5.

Example 1

In this embodiment a rare earth oxide is performing the task of either down conversion or up conversion and may be functioning as a distributed Bragg reflector, DBR.

By setting the thickness of the rare earth oxide according to a formula $$nd = m\lambda/4 \qquad (1)$$

where n=refractive index at λ, d=layer thickness and λ=wavelength at which the optical characteristics of the layer are specified and m is an odd integer; optionally, the same layer can be considered to be an anti reflective coating.

Example 2

Figure 3:
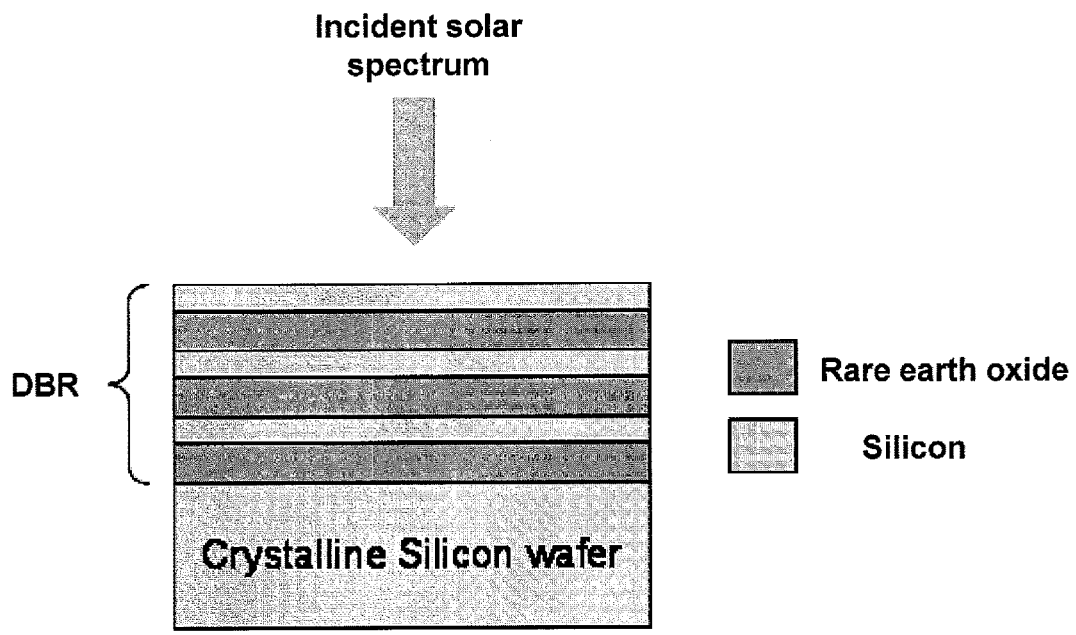

FIG. 3 illustrates several embodiments; a rare earth oxide is performing a task of down conversion. In some embodiments a rare earth oxide has a thickness conforming to $nd=m\lambda/4$, (where n=refractive index at λ, d=layer thickness, m is an odd integer and λ=wavelength at which the optical characteristics of the layer are specified). Additionally a silicon layer has a thickness also conforming to $nd=m\lambda/4$. The combination of multiple repeats of these two layers is nominally termed a Distributed Bragg Reflector (DBR) and may be designed to be anti-reflective layer over an expanded range when compared to the single layer approach of example 1. In this example a silicon layer within the DBR is doped electrically to conform to the chosen device architecture.

Example 3

Figure 4:
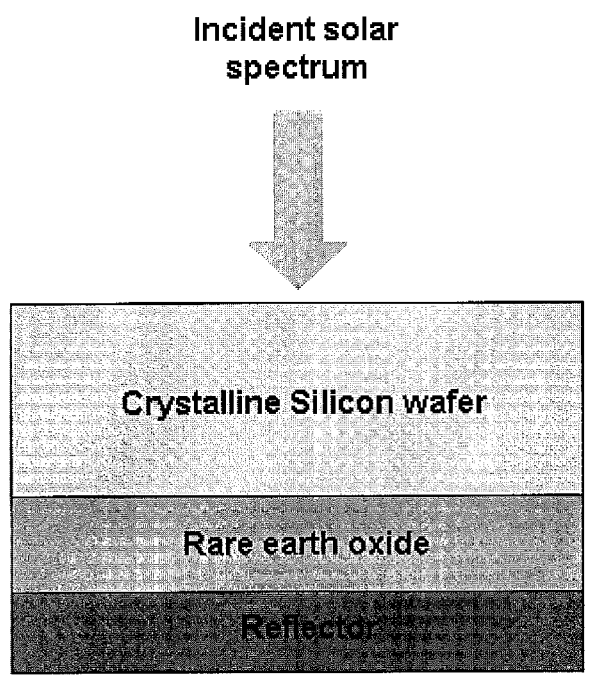

FIG. 4 shows an embodiment where a rare earth oxide is performing a task of up conversion. In this example a reflector can be any material that is tuned to be reflective to the wavelengths of the converted spectrum.

Example 4

Figure 5:
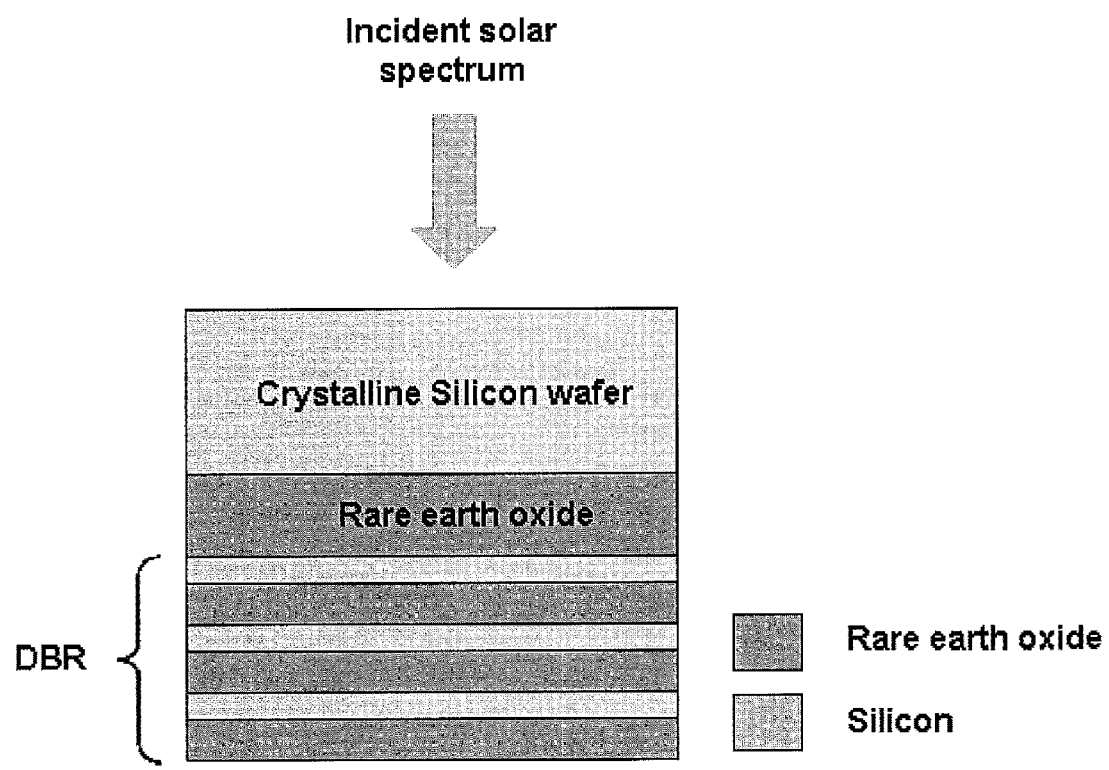

FIG. 5 shows an embodiment where a rare earth oxide is performing a task of up conversion. In this example a generic reflector of example 3 is replaced by a DBR design to be matched to the converted spectrum and the overall device architecture. The rare earth and silicon layers within the DBR have thicknesses conforming to $nd=m\lambda/4$, (where n=refractive index at λ, d=layer thickness, m=an odd integer and λ=wavelength at which the optical characteristics of the layer are specified). In this example a silicon layer within the DBR is doped electrically to conform with the chosen device architecture Example 5

Figure 6:
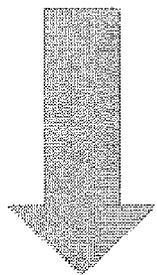
Figure 6:
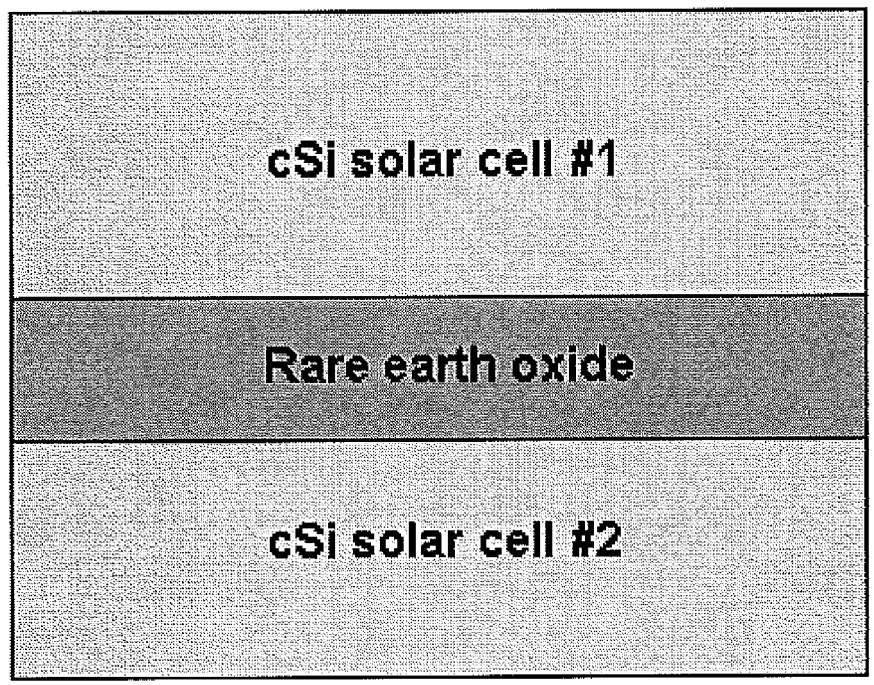

FIG. 6 shows an embodiment where a rare earth oxide is performing a task of up conversion. A second silicon layer is placed in the device to generate photocurrent from the converted spectrum coming from the up converting rare earth oxide layer.

Example 6

Figure 7:
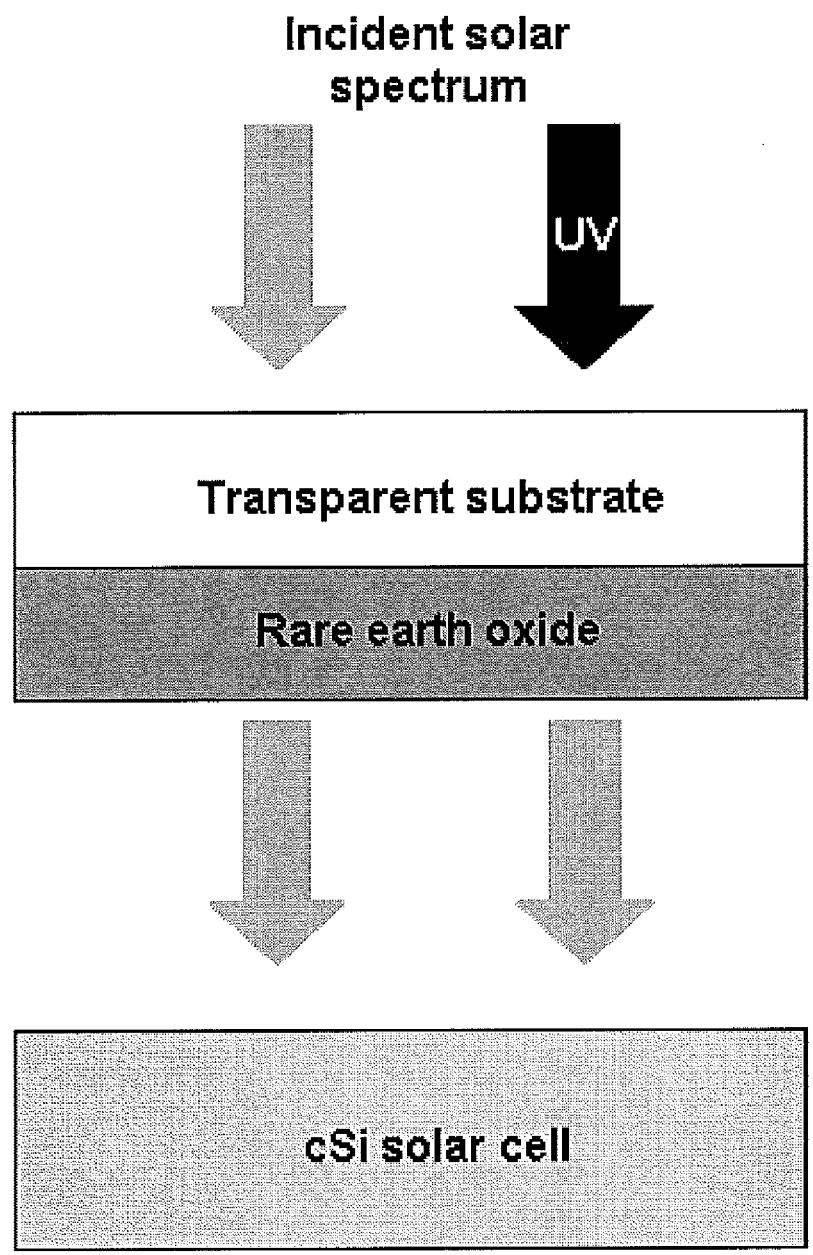
FIG. 7 is a schematic illustration of one embodiment with a RE oxide and a transparent substrate.

FIG. 7 shows an embodiment where a rare earth oxide is performing a task of down conversion. In this example a rare earth oxide is manufactured as a single crystal on a transparent substrate. The chosen material is substantially transparent to the portion of the spectrum normally used within a silicon based solar cell to generate photocurrent. However in portions of the UV spectrum that are not adsorbed efficiently by the silicon cell, a rare earth oxide performs a task of spectral down conversion. This rare earth oxide—transparent substrate combination may then be used in general proximity to any cell as shown below Example 7

Figure 8:
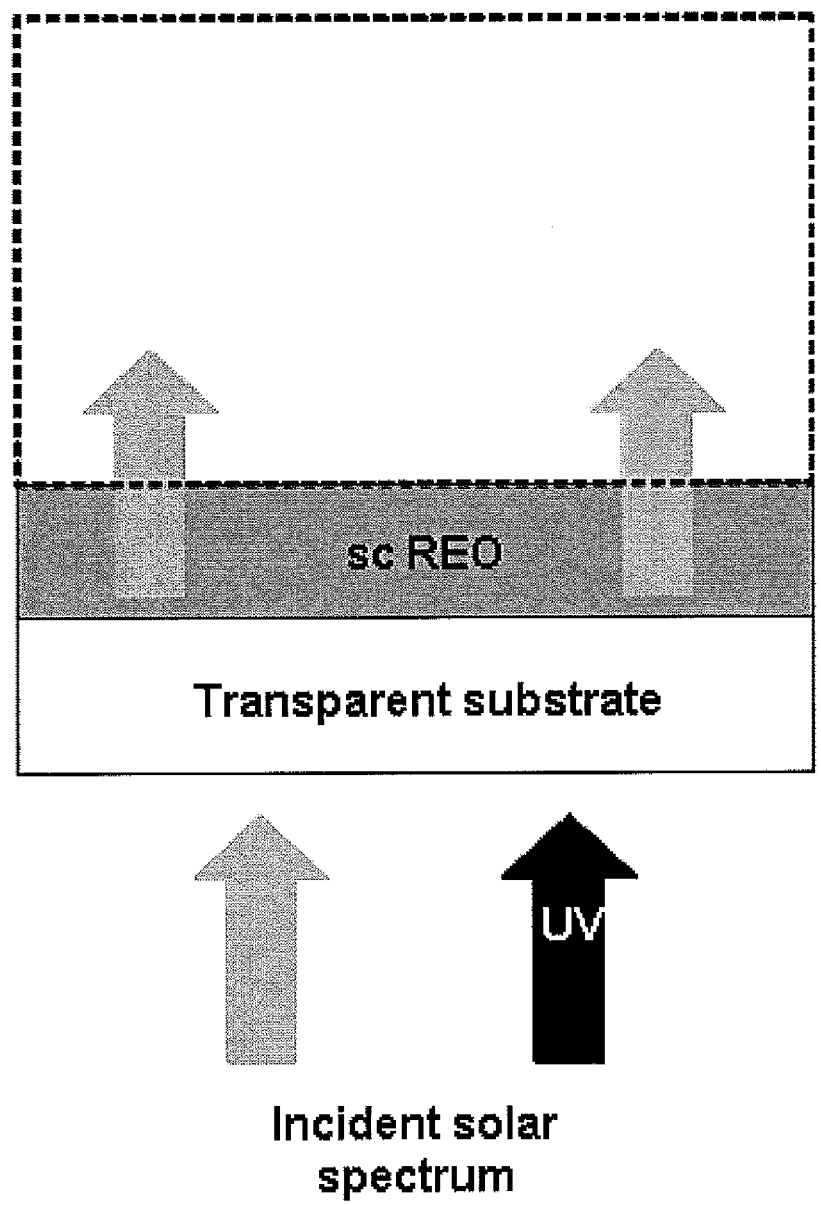
FIG. 8 is a schematic illustration of one embodiment with a RE oxide and a transparent substrate.

FIG. 8 shows an embodiment where a rare earth oxide, ReO, is on a transparent substrate but now this structure is used as a virtual substrate for any subsequent growth of additional photovoltaic material, optionally, single crystal or poly crystal or amorphous; FIG. 8 shows an alternative embodiment of the same concept where the [ReO] layer is providing down-conversion of incident UV radiation prior to passage into a solar cell, optionally silicon based or other material system.

In all examples listed herein it is disclosed that a rare earth layer(s) for up converting and/or down converting occurs with one or more layers comprising one or more rare earths in combination with one or more chosen from the group comprising oxygen, nitrogen, phosphorus, silicon, germanium, and carbon. A rare earth layer may be grown on a single crystal substrate or not; the substrate may be silicon or not; a rare earth layer for converting may be transferred to a different substrate for the converting. A rare earth layer may be deposited as single crystal, or multi-crystalline or amorphous; subsequent processing may be required to change a physical state of a rare earth layer to make it suitable for up and/or down converting, such as converting an amorphous layer to a large grained layer. A rare earth layer for up converting and/or down converting may be used in combination with one or more reflectors, Bragg layers, textured layers, or other optical components known to one knowledgeable in the field. In some embodiments a rare earth layer for up converting and/or down converting is also a reflector layer, Bragg layer, and/or textured layer.

In some embodiments a low cost substrate such as soda glass or polycrystalline alumina is used in combination with a rare-earth based structure comprising a diffusion barrier layer, a buffer layer, an active region, an up and/or down layer(s), one or more reflectors, one or more Bragg layers, texturing is optional; one or more layers may comprise a rare-earth. The exact sequence of the layers is application dependent; in some cases sunlight may enter a transparent substrate initially; in other cases a transparent substrate may be interior of multiple layers.

Figure 9:
FIG. 9 is a TEM of a silicon/rare earth DBR.

FIG. 9 shows a TEM of silicon—$Er_2O_3$ DBR.

Figure 10:
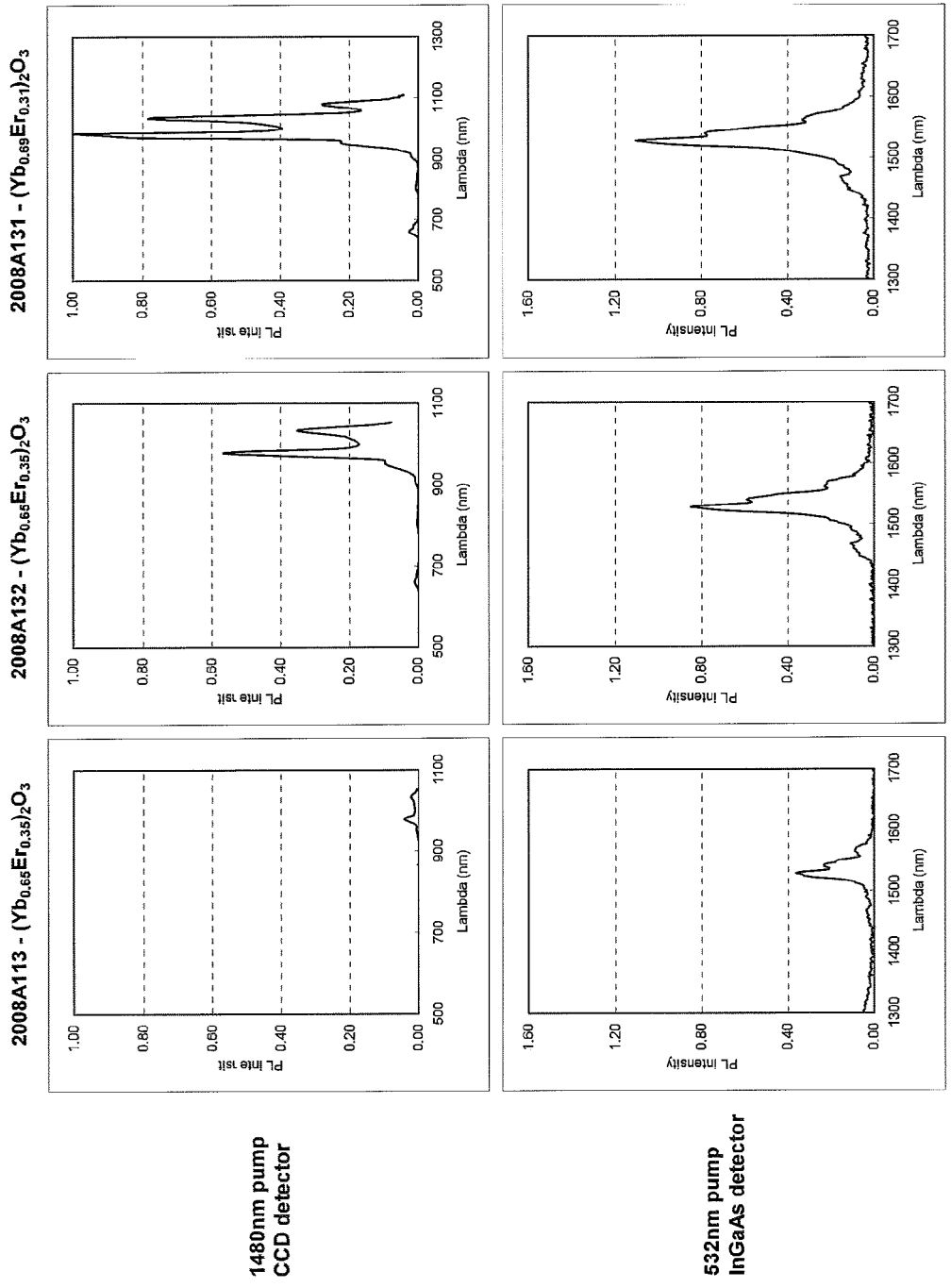
FIG. 10 shows photoluminescence data from an up-conversion and down conversion structures.

FIG. 10 is photoluminescence data from various samples of $(Yb_xEr_y)_mO_n$ showing spectral conversion in single crystal material (top=upconversion, bottom=down conversion) where, optionally, m=2 and n=3.

Figure 11:
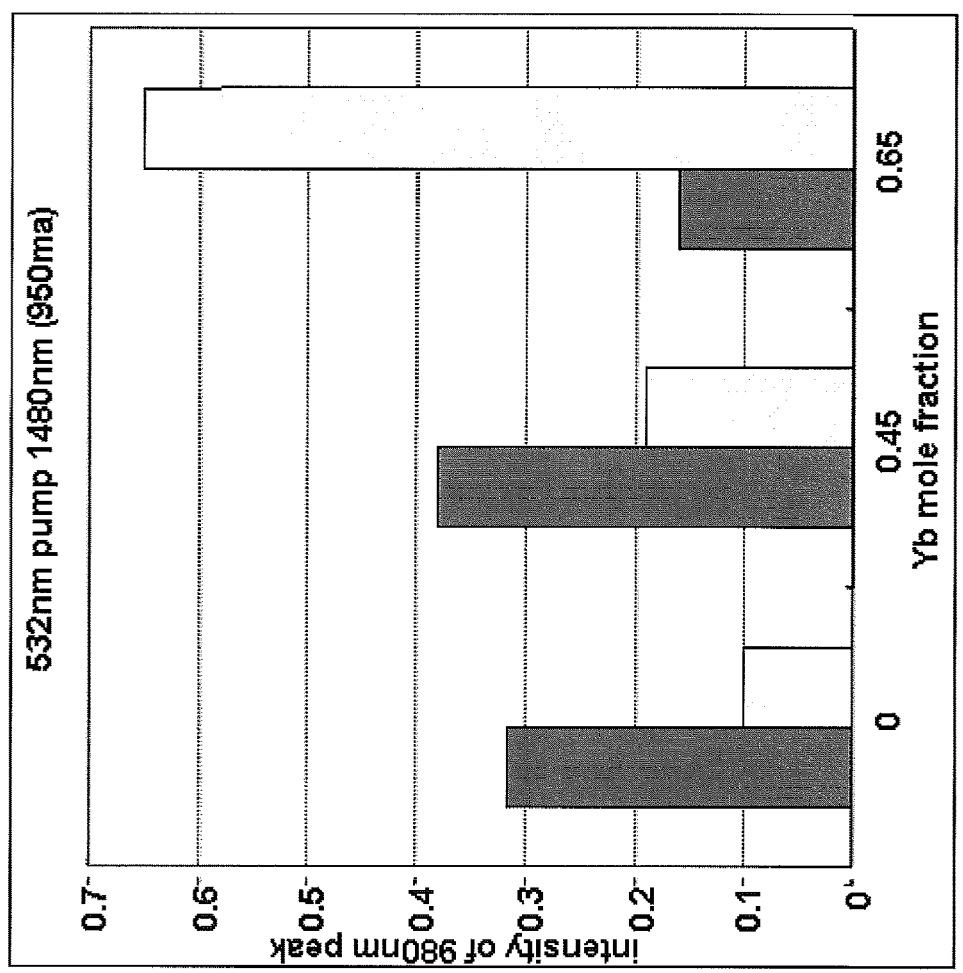
FIG. 11 shows photoluminescence data versus Yb mole fraction.

FIG. 11 shows photoluminescence data from various samples of $(Yb_{(1-y)}Er_y)_2O_3$ as a function of y.

Figure 12:
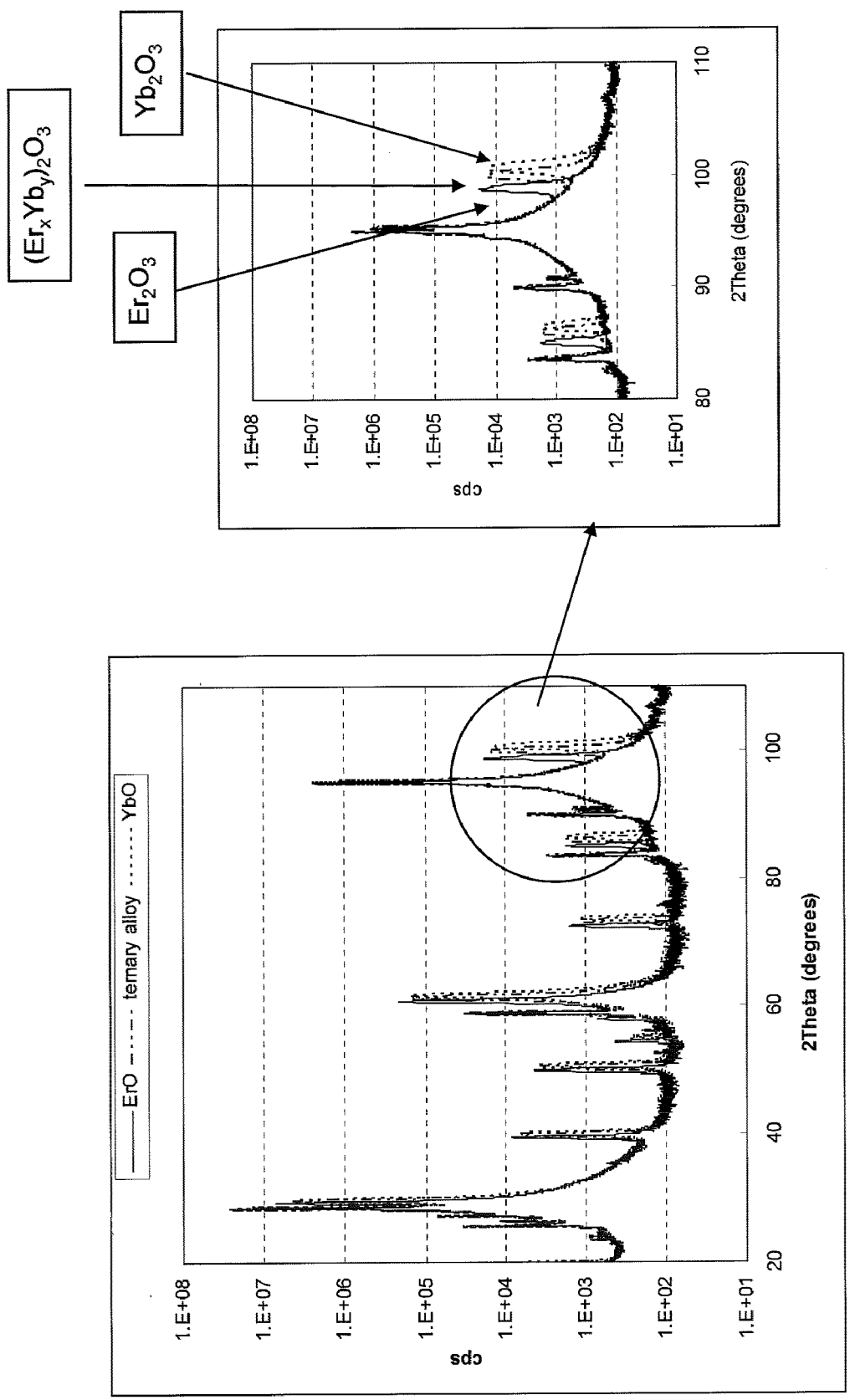
FIG. 12 shows diffraction data for binary and ternary rare earths.

FIG. 12 X-ray diffraction data for binary and ternary compounds of rare earths showing how precise control of the chosen compound can be maintained.

Figure 13:
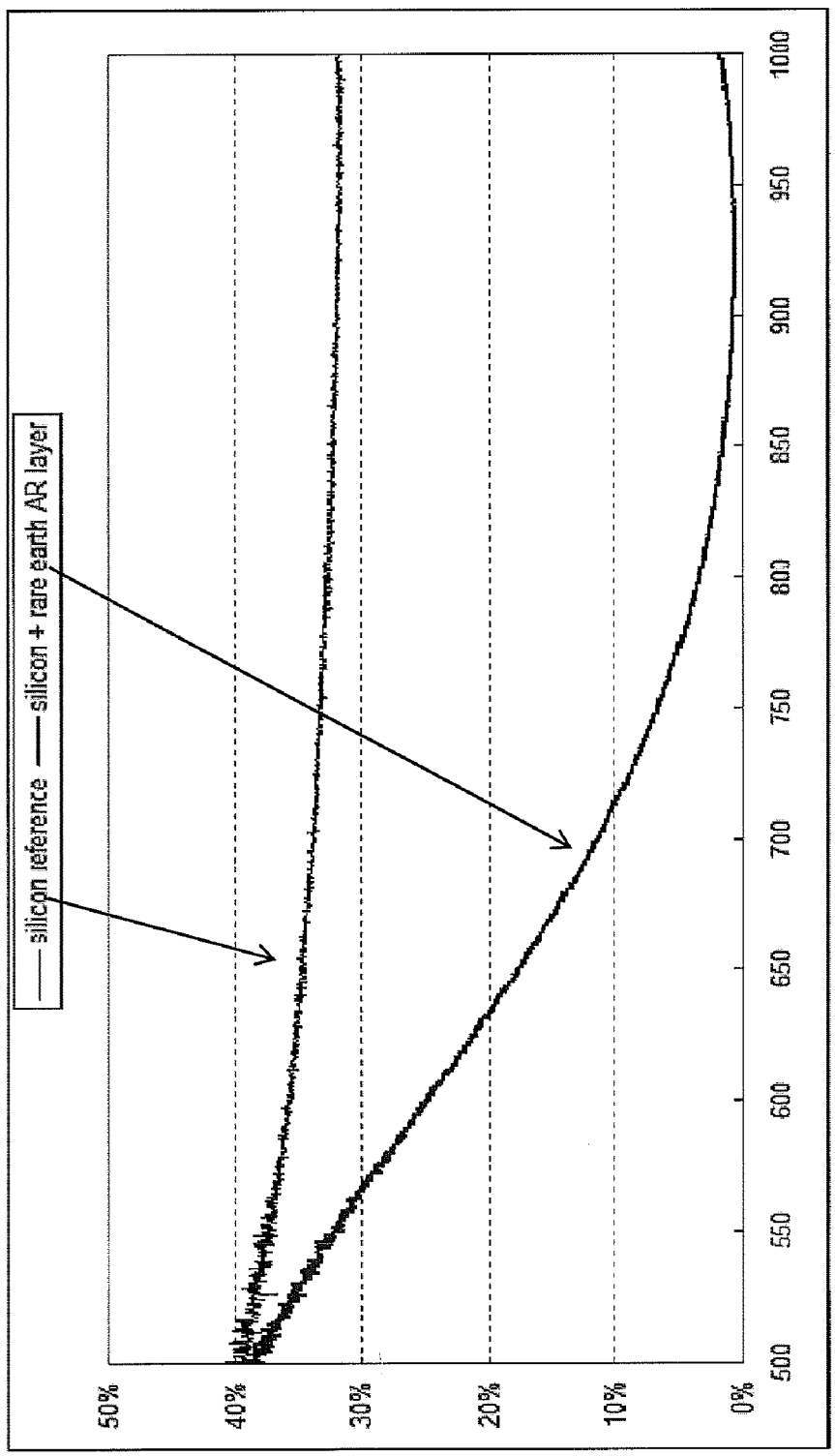
FIG. 13 is a plot of % reflectivity for ErO on silicon.

FIG. 13 Plot of % Reflectivity for ErO on silicon-non optimized

FIG. 14 is X-ray data for rare earth oxide on transparent substrate showing single crystal nature of the rare earth oxide.

Figure 15B:
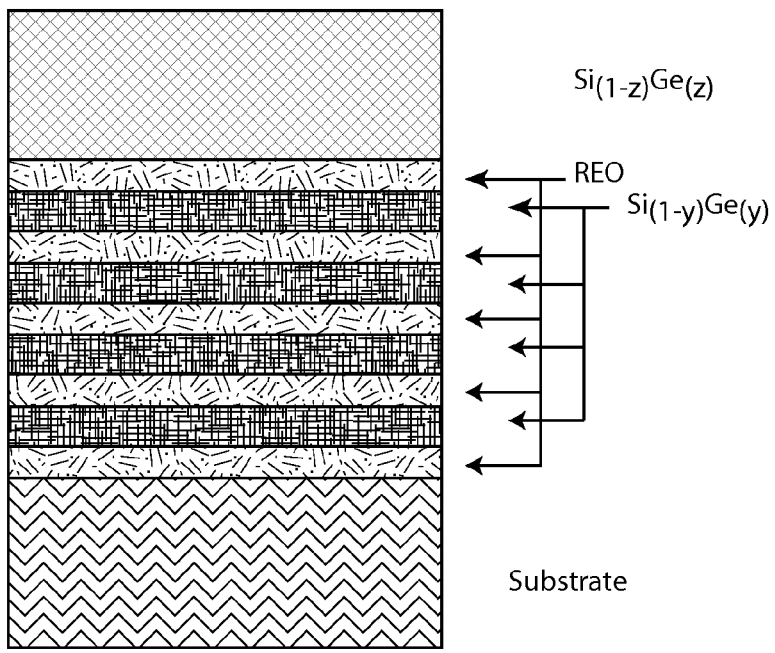

FIG. 15A illustrates several embodiments; in one embodiment rare earth oxide layers are performing the task of up conversion, and Si(1-z)Ge(z) and Si(1-x)Ge(x) layers are photovoltaic energy converting layers with appropriate electrical contacts and doping profiles for such a function. In another embodiment a REO/Si(1-y)Ge(y) composite layer is performing the task of up conversion. In another embodiment rare earth oxide layers are also performing a task of strain balancing, such that the net strain in the REO/Si(1-y)Ge(y) composite layer is effectively reduced over that of a single REO layer of the same net REO thickness grown on the same substrate, thus allowing a greater total thickness of REO to be incorporated into the structure before the onset of plastic deformation. In another embodiment rare earth oxide layers are strain balanced such that a critical thickness of the REO/Si(1-y)Ge(y) composite is not exceeded. In another embodiment REO/Si(1-y)Ge(y) composite layer acts to mitigate propagation of dislocations from an underlying Si(1-x)Ge(x) layer through to the overlying Si(1-z)Ge(z) layer thereby improving the crystallinity and carrier lifetime in the Si(1-z)Ge(z) layer. In another embodiment, the Si(1-x)Ge(x) has a narrower bandgap than the Si(1-z)Ge(z) layer (i.e. x>z) such that the Si(1-z)Ge(z) layer and the Si(1-x)Ge(x) layers form a tandem solar cell. For example, solar radiation impinges upon the Si(1-z)Ge(z) layer first where photons of energy greater than the bandgap of Si(1-z)Ge(z) are absorbed and converted to electrical energy. Photons with energy less than the bandgap of Si(1-z)Ge(z) are passed through to the Si(1-x)Ge(x) layer where they may be absorbed. Some embodiments combine all of the disclosed features for FIG. 15A In FIG. 15B several embodiments are disclosed; in one embodiment rare earth oxide layers are performing the task of up conversion, and a Si(1-z)Ge(z) layer is a photovoltaic energy converting layer with appropriate electrical contacts and doping profiles for such a function. In one embodiment a REO/Si(1-y)Ge(y) composite layer is performing the task of up conversion. In one embodiment rare earth oxide layers are performing a task of strain balancing, such that the net strain in the REO/Si(1-y)Ge(y) composite layer is effectively reduced over that of a single REO layer of the same net REO thickness grown on the same substrate. In one embodiment rare earth oxide layers are strain balanced such that critical thickness of the REO/Si(1-y)Ge(y) composite is not exceeded. In one embodiment a REO/Si(1-y)Ge(y) composite layer acts to mitigate propagation of dislocations from an underlying REO layer through to the overlying Si(1-z)Ge(z) layer thereby improving the crystallinity and carrier lifetime in the Si(1-z)Ge(z) layer.

FIGS. 16A, B and C illustrate several embodiments; in one embodiment a rare-earth oxide spectral conversion structure, fabricated on, underneath, or within solar cell devices for the purpose of modifying the spectral distribution of the incident radiation. In some embodiments a spectral conversion structure comprises a core layer, optionally, optically active, of $(Gd_{(1-x)}Er_{(x)})_2O_3$ or other ternary rare-earth compound, in contact with one or more cladding layers of $Gd_2O_3$ or other binary rare-earth compound. A cladding layer is designed such that there is substantially no overlap of excited energy levels with those in the core, hence a preference for $Gd_2O_3$ over other rare-earth oxides, since it has no energy levels within the solar spectrum. A core layer performs spectral conversion through absorption of light at one or more wavelengths, and emitting light at a different wavelength which is absorbed by a solar cell(s) and converted to electrical energy.

In FIGS. 17A, B and C spectral conversion structures are shown where RE1 is selected such that there is no overlap between energy levels in a cladding and a core material. RE1 and RE2 are selected to give desired optical activity in a core layer.

A key novelty of the instant invention is the isolation of the energy levels in the core by cladding it with a material which contains no overlapping energy levels, thereby preventing resonant energy transfer from a core to quenching sites at the interfaces. This isolation effectively increases the lifetime of the energy levels in the core, thus improving the efficiency of optical wavelength conversion processed in the core layer.

FIG. 18 illustrates a rare-earth oxide spectral conversion structure, fabricated on top of and underneath a solar cell. The top three layers perform a down-conversion or downshifting function, where short wavelength light, for example, less than 500 nm, is converted to longer wavelength light, for example, about 980 nm, which can be efficiently absorbed in the solar cell structure. Again, RE1 and RE2 are selected such that there is no overlap between the energy levels in the cladding and the core material. RE1 and RE2 are also selected to give the desired optical activity in the core layer. Additional up-conversion layers may be fabricated on the back of the solar cell; the three layers closest to the back of the cell have the function of up-converting 1100-1400 nm wavelength light. The next two layers are for up-converting 1400-1800 nm light and the last two are for up-conversion of 1900-2500 nm light. RE3, RE4 and RE5 are chosen to be optically active rare earth species; while RE1 is chosen to form a suitable optically inactive dilutant and passivation layer. In one embodiment RE1 is Gadolinium, RE2 is Terbium, x is 0.1, RE3 is Dysprosium, y is 0.1, RE4 is Erbium, z is 0.1, and RE5 is Dysprosium, w is 0.1. These rare-earths have suitable absorption peaks in each of the wavelength bands of interest. The structure of FIG. 18 may also comprise a reflector structure, not shown, placed behind the last layer so as to reflect the up-converted radiation back through the rare earth layers to a photovoltaic layer, optionally shown as a solar cell.

In some embodiments a structure for converting incident radiation from one wavelength to another comprises a first layer comprising a rare earth compound; and a second layer comprising a semiconductor operable as a photovoltaic cell; such that incident radiation comprising a first wavelength incident on the first layer is converted into one or more wavelengths different than the first wavelength wherein at least a portion of the one or more wavelengths different than the first wavelength are absorbed by the second layer and converted into electrical energy. Optionally, the first layer comprises an initial cladding layer and a secondary cladding layer comprising a compound of composition $[RE1]_x[J]_y$ and a core layer comprising a compound of composition $(RE1_mRE2_n)_oJ_p$ positioned between the initial and secondary cladding layers wherein said first layer is positioned between said incident radiation and said second layer such that at least a portion of said incident radiation is down-converted from a higher energy to a lower energy before being absorbed by said second layer. Optionally, RE1 and RE2 are chosen such that there is no overlap between the energy levels in said cladding layers and said core layers and m, n, o, p, x, y>0 and J is chosen from a group comprising oxygen, nitrogen, phosphorous and combinations thereof.

Some embodiments comprise a third layer comprising an initial cladding layer and a secondary cladding layer comprising a compound of composition $[RE1]_e[J]_f$ and a core layer comprising a compound of composition $(RE1_aRE3_b)_cJ_d$ positioned between the initial and secondary cladding layers wherein the third layer is positioned such that said incident radiation has passed through said second layer into the initial cladding layer such that at least a portion of said incident radiation is up-converted from a lower energy to a higher energy by the third layer; optionally, RE1 and RE3 are chosen such that there is no overlap between the energy levels in said cladding layers and said core layers and a, b, c, d, e, f>0 and J is chosen from a group comprising oxygen, nitrogen, phosphorous and combinations thereof.

In some embodiments a distributed Bragg reflector is positioned on said third layer away from said second layer comprising a plurality of sets of first and second layers wherein the first layer is of a composition $[RE]x[J]y$ and the second layer is of composition $[Si]m[Ge]n$ wherein m, x, y>0, and n≧0 and J is chosen from a group comprising oxygen, nitrogen, phosphorous and combinations thereof, optionally a reflector layer is placed such that the third layer is between the reflector layer and said second layer.

Some embodiments comprise a fourth layer comprising a secondary cladding layer comprising a compound of composition $[RE1]_g[J]_h$ and a core layer comprising a compound of composition $(RE1_iRE4_j)_kJ_l$ positioned between the secondary cladding layer and said secondary cladding layer of the third layer wherein g, h, i, j, k, l>0, and J is chosen from a group comprising oxygen, nitrogen, phosphorous and combinations thereof such that the incident radiation has passed through the third layer such that at least a portion of the incident radiation is up-converted from a lower energy to a higher energy by the fourth layer; optionally, a reflector layer is placed such that the secondary cladding layer of the fourth layer is between the reflector layer and the core layer of the fourth layer.

In some embodiments a structure for converting radiation from one wavelength to another comprises a plurality of layers comprising a semiconductor layer operable as a photovoltaic cell and a rare earth compound layer; and a substrate wherein the first of the plurality of layers comprises a semiconductor layer of composition $Si_{(1-m)}Ge_m$ and a rare earth layer of composition $[RE1]_x[J]_y$; the second of the plurality of layers comprises a semiconductor layer of composition $Si_{(1-n)}Ge_n$ and a rare earth layer of composition $[RE2]_u[J]_v$; and the plurality of layers is separated from the substrate by a semiconductor layer of composition $Si_{(1-o)}Ge_o$; wherein u, v, x, y>0, and m, n, o≧0 and J is chosen from a group comprising oxygen, nitrogen, phosphorous and combinations thereof; optionally, rare earth layers convert radiation from a low energy to a higher energy.

In some embodiments a structure for converting incident radiation from one wavelength to another comprise a first cladding layer comprising a first rare earth compound; a core layer comprising a second rare earth compound; a second cladding layer comprising the first rare earth compound; and a photovoltaic layer operable to convert at least a portion of the incident radiation to electrical energy comprising a first and second surface; wherein the core layer resides between the first and second cladding layer and the second cladding layer is in contact with the first surface of the photovoltaic layer such that incident radiation passes through the first cladding layer prior to entering the photovoltaic layer such that a portion of the incident radiation is converted from an initial wavelength to a different wavelength by said core layer; optionally the first and second cladding layers comprise a compound of composition $[RE1]_x[J]_y$ and said core layer comprises a compound of composition $(RE1_mRE3_n)_oJ_p$ wherein m, n, o, p, x, y>0 and J is chosen from a group comprising oxygen, nitrogen, phosphorous and combinations thereof such that there is no overlap between the energy levels in said cladding layers and said core layer; optionally, the composition of said core layer is chosen such that a portion of said incident radiation is up-converted from a longer wavelength to a shorter wavelength.

In some embodiments a structure for converting incident radiation from one wavelength to another comprises a first cladding layer comprising a first rare earth compound; a core layer comprising a second rare earth compound; a second cladding layer comprising the first rare earth compound; and a first and second photovoltaic layer operable to convert at least a portion of the incident radiation to electrical energy each comprising a first and second surface; wherein the core layer resides between the first and second cladding layer and the first cladding layer is in contact with the second surface of the first photovoltaic layer such that incident radiation passes through the first photovoltaic layer prior to entering the first cladding layer and the second cladding layer is in contact with the first surface of the second photovoltaic layer such that incident radiation passes through the core layer prior to entering the second photovoltaic layer such that a portion of the incident radiation is converted from an initial wavelength to a different wavelength by the core layer; optionally, first and second cladding layers comprise a compound of composition $[RE1]_x[J]_y$ and said core layer comprises a compound of composition $(RE1_m RE3_n)_o J_p$ wherein m, n, o, p, x, y>0 and J is chosen from a group comprising oxygen, nitrogen, phosphorous and combinations thereof such that there is no overlap between the energy levels in said cladding layers and said core layers; optionally the composition of the core layer is chosen such that a portion of said incident radiation is up-converted from a longer wavelength to a shorter wavelength.

In some embodiments device, comprises a silicon semiconductor based superlattice comprising a plurality of layers that form a plurality of repeating units, wherein at least one of the layers in the repeating unit is an optically active layer with at least one species of rare earth ion wherein the repeating units have two layers comprising a first layer comprising a rare earth compound described by $[RE1]_x[J]_y$ and a second layer comprising a compound described by $Si_{(1-m)}Ge_m$ wherein x, y>0, m≧0 and J is chosen from a group comprising oxygen, nitrogen, phosphorous and combinations thereof.

In some embodiments a device, comprises a superlattice that includes a plurality of layers that form a plurality of repeating units, wherein at least one of the layers in the repeating unit is an optically active layer with at least one species of rare earth ion wherein the repeating units comprise two layers wherein the first layer comprises a rare earth compound described by $[RE1]_x[J]_y$ and the second layer comprises a compound described by $((RE2_m RE3_n)_o J_p$ wherein m, n, o, p, x, y>0 and J is chosen from a group comprising oxygen, nitrogen, phosphorous and combinations thereof; optionally, RE1, RE2 and RE3 may refer to different rare earths in different repeating units as suggested in FIG. 18.

In some embodiments a structure for converting incident radiation from one wavelength to another comprises a first layer comprising a semiconductor operable as a photovoltaic cell; and a second layer comprising a rare earth compound; such that incident radiation comprising a first wavelength is incident on the first layer and the first wavelength is substantially transmitted through the first layer to the second layer and is converted therein into one or more wavelengths different than the first wavelength; optionally, the second layer comprises an initial cladding layer and a secondary cladding layer comprising a compound of composition $[RE1]_x[J]_y$ and a core layer comprising a compound of composition $(RE1_m RE2_n)_o J_p$ positioned between the initial and secondary cladding layers wherein said second layer is positioned behind said first layer such that at least a portion of said incident radiation passes through said first layer before entering said second layer; optionally, RE1 and RE2 are chosen such that there is no overlap between the energy levels in said cladding layers and said core layers and m, n, o, p, x, y>0 and J is chosen from a group comprising oxygen, nitrogen, phosphorous and combinations thereof.

In some embodiments a third layer comprises a secondary core layer comprising a compound of composition $(RE1_u RE3_v)_w J_z$ positioned between said secondary cladding layer and a tertiary cladding layer comprising a compound of composition $[RE1]_k[J]_l$ wherein the third layer is positioned such that said incident radiation has passed through said second layer into the third layer such that at least a portion of said incident radiation is up-converted from a lower energy to a higher energy by the secondary core layer; optionally, RE1 and RE3 are chosen such that there is no overlap between the energy levels in said cladding layers and said core layers and u, v, w, z, k, l>0 and J is chosen from a group comprising oxygen, nitrogen, phosphorous and combinations thereof; optionally a reflector layer is placed such that the tertiary cladding layer of said third layer is between the reflector layer and said secondary core layer of said third layer.

As known to one knowledgeable in the art, a photovoltaic device may be constructed from a range of semiconductors including ones from Group IV materials, Group III-V materials and Group II-VI; additionally, photovoltaic devices such as a laser, LED and OLED may make advantageous use of the instant invention for up and/or down converting emitted light.

The foregoing described embodiments of the invention are provided as illustrations and descriptions. They are not intended to limit the invention to a precise form as described. In particular, it is contemplated that functional implementation of invention described herein may be implemented equivalently in hardware and/or various combinations of hardware and software and/or other available functional components or building blocks. Other variations and embodiments are possible in light of above teachings to one knowledgeable in the art, and it is thus intended that the scope of invention not be limited by this Detailed Description, but rather by Claims following. All patents, patent applications, and other documents referenced herein are incorporated by reference in their entirety for all purposes, unless otherwise indicated.

We claim:

1. A structure comprising at least two photovoltaic cells in tandem for converting incident radiation from one wavelength to another comprising;
   a plurality of layers comprising a semiconductor layer operable as a photovoltaic cell; and
   a rare earth compound layer; wherein the incident radiation is incident on the first of the plurality of layers consisting of a semiconductor layer of composition $Si_{(1-m)}Ge_m$ and a rare earth layer consisting of composition $[RE1]_x[J]_y$; the second of the plurality of layers is in contact with the first of the plurality of layers and comprises a semiconductor layer consisting of composition $Si_{(1-n)}Ge_n$ and a rare earth layer consisting of composition $[RE2]_u[J]_v$; wherein u, v, x, y>0, and m, n, >0 and J is chosen from a group consisting of oxygen, nitrogen, phosphorous and combinations thereof and RE1 and RE2 are different rare earths.

2. The structure of claim 1 wherein said rare earth layers of the first and second plurality of layers are converting radiation from a low energy to a higher energy.

3. A structure comprising at least two photovoltaic cells in tandem for converting incident radiation from one wavelength to another comprising;
   a first cladding layer consisting of a first rare earth compound;
   a core layer consisting of a second rare earth compound;

a second cladding layer consisting of the first rare earth compound; and first and second photovoltaic layers operable to convert at least a portion of the incident radiation to electrical energy, wherein each photovoltaic layer comprises a first and second surface; wherein the core layer resides between the first and second cladding layer and the first cladding layer is in contact with the second surface of the first photovoltaic layer such that incident radiation passes through the first photovoltaic layer prior to entering the first cladding layer and the second cladding layer is in contact with the first surface of the second photovoltaic layer such that incident radiation passes through the core layer prior to entering the second photovoltaic layer such that a portion of the incident radiation is converted from an initial wavelength to a different wavelength by the core layer.

4. The structure of claim 3 wherein said first and second cladding layers consist of a compound of composition $[RE1]_x[J]_y$ and said core layer consists of a compound of composition $(RE1_m RE3_n)_o J_p$ wherein m, n, o, p, x, y>0 and J is chosen from a group consisting of oxygen, nitrogen, phosphorous and combinations thereof such that there is no overlap between the energy levels in said cladding layers and said core layers and RE1 and RE3 are different rare earths.

5. The structure of claim 4 wherein the composition of said core layer is chosen such that a portion of said incident radiation is up-converted from a longer wavelength to a shorter wavelength.

6. A structure comprising at least two photovoltaic cells in tandem for converting incident radiation from one wavelength to another comprising;

a first layer consisting of a semiconductor operable as a photovoltaic device; and a second layer consisting of a rare earth compound; a third layer consisting of a semiconductor operable as a photovoltaic device; the first layer and third layer being arranged in tandem; such that incident radiation comprising a first wavelength is incident on the first layer and a portion of the first wavelength is substantially transmitted through the first layer to the second layer and is converted therein into one or more wavelengths different than the first wavelength for subsequent passage through the third layer.

7. The structure of claim 6 wherein said second layer comprises an initial cladding layer and a secondary cladding layer consisting of a compound of composition $[RE1]_x[J]_y$ and a core layer consisting of a compound of composition $(RE1_m RE2_n)_o J_p$ positioned between the initial and secondary cladding layers wherein said second layer is positioned behind said first layer such that at least a portion of said incident radiation passes through said first layer before entering said second layer and RE1 and RE2 are different rare earths.

8. The structure of claim 7 wherein RE1 and RE2 are chosen such that there is no overlap between the energy levels in said cladding layers and said core layers and m, n, o, p, x, y>0 and J is chosen from a group consisting of oxygen, nitrogen, phosphorous and combinations thereof.

9. The structure of claim 7 further comprising a third layer comprising a secondary core layer consisting of a compound of composition $(RE1_u RE3_v)_w J_z$ positioned between said secondary cladding layer and a tertiary cladding layer comprising consisting of a compound of composition $[RE1]k[J]l$ wherein the third layer is positioned such that said incident radiation has passed through said second layer into the third layer such that at least a portion of said incident radiation is up-converted from a lower energy to a higher energy by the secondary core layer.

10. The structure of claim 9 wherein RE1 and RE3 are chosen such that there is no overlap between the energy levels in said cladding layers and said core layers and u, v, w, z, k, l>0 and J is chosen from a group consisting of oxygen, nitrogen, phosphorous and combinations thereof.

11. The structure of claim 10 further comprising a reflector layer placed such that said tertiary cladding layer of said third layer is between the reflector layer and said secondary core layer of said third layer.

12. The structure of claim 6 further comprising an initial layer consisting of a rare earth compound positioned in front of said first layer such that incident radiation comprising a first wavelength incident on the initial layer is converted into one or more wavelengths different than the first wavelength wherein at least a portion of the one or more wavelengths different than the first wavelength are absorbed by said first layer and converted into electrical energy.

13. The structure of claim 12 wherein said initial layer comprises an initial cladding layer and a secondary cladding layer consisting of a compound of composition $[RE5]x[J]y$ and a core layer consisting of a compound of composition $(RE5mRE6n)oJp$ positioned between the initial and secondary cladding layers such that at least a portion of said incident radiation is down-converted from a higher energy to a lower energy before being absorbed by said first layer.

14. The structure of claim 13 wherein RE5 and RE6 are chosen such that there is no overlap between the energy levels in said cladding layers and said core layers and m, n, o, p, x, y>0 and J is chosen from a group consisting of oxygen, nitrogen, phosphorous and combinations thereof.

15. The structure of claim 6 further comprising a distributed Bragg reflector positioned behind said second layer comprising a plurality of sets of fifth and sixth layers wherein the fifth layer consists of a composition $[RE]_x[J]_y$ and the sixth layer consists of composition $[Si]_m[Ge]_{1-m}$ wherein x, y>0, and m≧0 and J is chosen from a group consisting of oxygen, nitrogen, phosphorous and combinations thereof.

* * * * *